(12) United States Patent
Chern

(10) Patent No.: US 11,049,947 B2
(45) Date of Patent: Jun. 29, 2021

(54) NON-VOLATILE MEMORY AND MANUFACTURING METHOD FOR THE SAME

(71) Applicant: NEXCHIP SEMICONDUCTOR CO., LTD., Anhui (CN)

(72) Inventor: Geeng-Chuan Chern, Anhui (CN)

(73) Assignee: NEXCHIP SEMICONDUCTOR CO., LTD., Anhui (CN)

( * ) Notice: Subject to any disclaimer, the term of this patent is extended or adjusted under 35 U.S.C. 154(b) by 0 days.

(21) Appl. No.: 16/677,513

(22) Filed: Nov. 7, 2019

(65) Prior Publication Data
US 2020/0152649 A1    May 14, 2020

(30) Foreign Application Priority Data
Nov. 13, 2018   (CN) .......................... 201811345719.3

(51) Int. Cl.
| H01L 29/423 | (2006.01) |
| G11C 5/06 | (2006.01) |
| H01L 27/11519 | (2017.01) |
| H01L 27/11524 | (2017.01) |

(52) U.S. Cl.
CPC ........ H01L 29/42328 (2013.01); G11C 5/063 (2013.01); H01L 27/11519 (2013.01); H01L 27/11524 (2013.01)

(58) Field of Classification Search
CPC ......... H01L 29/42328; H01L 29/42344; H01L 27/11524; H01L 27/11519; H01L 27/11521; G11C 5/063
See application file for complete search history.

(56) References Cited

U.S. PATENT DOCUMENTS

| 9,391,151 | B2 * | 7/2016 | Wu | .................... | H01L 29/40114 |
| 9,917,165 | B2 * | 3/2018 | Wu | ........................ | H01L 29/788 |
| 10,644,011 | B1 * | 5/2020 | Fan | .................... | H01L 27/11521 |
| 2009/0075467 | A1 * | 3/2009 | Liao | .................... | H01L 29/7887 |
| | | | | | 438/593 |
| 2009/0200600 | A1 * | 8/2009 | Nagai | ............... | H01L 29/40114 |
| | | | | | 257/324 |
| 2014/0126299 | A1 * | 5/2014 | Fukumoto | ......... | H01L 29/66825 |
| | | | | | 365/185.33 |

* cited by examiner

Primary Examiner — Allison Bernstein
(74) Attorney, Agent, or Firm — Global IP Services; Tianhu Gu

(57) ABSTRACT

The present invention provides a non-volatile memory and a manufacturing method for the same. A floating gate structure of the non-volatile memory is located on one side of a word line structure, and includes a second gate dielectric layer and a second conductive layer in sequence from bottom to top. The second conductive layer has a first sharp portion, a second sharp portion, and a sharp depression portion located between the two sharp portions. An erasing gate structure is located above the floating gate structure, and includes a tunneling dielectric layer and a third conductive layer in sequence from bottom to top. The tunneling dielectric layer covers tip parts of the first and second sharp portions, and is filled into the sharp depression portion. The third conductive layer has a third sharp portion at a position corresponding to the sharp depression portion.

16 Claims, 14 Drawing Sheets

A-A'

NON-VOLATILE MEMORY AND MANUFACTURING METHOD FOR THE SAME

BACKGROUND OF THE PRESENT INVENTION

Field of Invention

The present invention relates to the technical field of semiconductor, and in particular, to a non-volatile memory and a manufacturing method for the same.

Description of Related Arts

A non-volatile memory (NVM) refers to a computer memory in which the stored data will not disappear when power supply is turned off. Non-volatile memories can be classified into two major categories: read-only memories (ROMs) and flash memories, depending on whether data stored in a memory can be rewritten at any time while a computer is used. For the read-only memory, data cannot be changed or deleted once being stored, and content will not disappear after a power supply is turned off. Therefore, the read-only memory is usually used for storing programs or data that does not need to be changed in an electronic system or a computer system. The flash memory is an electrically erasable programmable read-only memory which allows erase or write for multiple times during operations. This technology is mainly used for general data storage and for data exchange and transmission between a computer and other digital products, such as a memory card and a USB flash disk.

In order to erase quickly with a low power, a tunneling dielectric layer between a floating gate and an erasing gate is usually thin as the tunneling effect between the floating gate and the erasing gate is restricted. However, the material of the existing tunneling dielectric layer is generally silicon oxide or silicon nitride. A thin tunneling dielectric layer easily causes current leakage, and electric charge stored in the floating gate will leak to the erasing gate and be erased, thereby causing poor data retention.

The U.S. Pat. No. 9,502,581B2 describes a non-volatile floating gate memory cell. The memory cell enhances the tunneling effect between the floating gate and the erasing gate by using sharp structures on two sides of the floating gate. In addition, the tunneling dielectric layer between the floating gate and the erasing gate is thick, thereby preventing the current leakage and improving the data retention. However, the technical solution in the U.S. Pat. No. 9,502,581B2 has another problem. The design of two independent transistors causes a large memory cell size, which does not meet the requirement of miniaturizing memory cells.

Therefore, it has been urgent to reduce the size of a memory cell and improve data retention.

SUMMARY OF THE PRESENT INVENTION

In view of the foregoing disadvantages in the prior art, an object of the present invention is to provide a non-volatile memory and a manufacturing method for the same, to resolve the problem that the thin tunneling dielectric layer of the split-gate memory in the prior art easily causes current leakage and results in poor data retention of the memory.

In order to accomplish the above and other related objects, the present invention provides a non-volatile memory, comprising: a substrate; at least one word line structure, located on the substrate, wherein the at least one word line structure comprises a first gate dielectric layer and a first conductive layer in sequence from bottom to top; at least one floating gate structure, located on the substrate, where the at least one floating gate structure is located on one side of the word line structure and comprises a second gate dielectric layer and a second conductive layer in sequence from bottom to top, an isolation sidewall is disposed between the second conductive layer and the word line structure, and the second conductive layer has a first sharp portion, a second sharp portion, and a sharp depression portion located between the first sharp portion and the second sharp portion; and at least one erasing gate structure, located above the floating gate structure, wherein the at least one erasing gate structure comprises a tunneling dielectric layer and a third conductive layer in sequence from bottom to top, where the tunneling dielectric layer covers tip parts of the first sharp portion and the second sharp portion and is filled into the sharp depression portion, and the third conductive layer has a third sharp portion at a position corresponding to the sharp depression portion.

Optionally, a concave corner is formed on an external sidewall of the second sharp portion, and a dielectric sidewall is provided at the concave corner.

Optionally, the tunneling dielectric layer further covers non-tip parts of the second conductive layer, and the third conductive layer covers the tunneling dielectric layer.

Optionally, the non-volatile memory further comprises at least one source region and at least one drain region, where the word line structure, the floating gate structure, and the erasing gate structure jointly form a gate structure, the source region and the drain region are located in the substrate, and are located on each side of the gate structure respectively, the source region is close to the floating gate structure, and the drain region is close to the word line structure.

Optionally, the non-volatile memory further comprises at least one sidewall structure, where the sidewall structure is located on each side of the gate structure.

Optionally, the non-volatile memory further comprises a silicide layer, an interlayer dielectric layer, at least one metal bit line, and at least one contact plug, where the silicide layer is located on the surface of the source region, the surface of the drain region and the surface of the third conductive layer; the interlayer dielectric layer is located on the substrate and covers the gate structure, the at least one metal bit line is located on the interlayer dielectric layer, the at least one contact plug is located in the interlayer dielectric layer, a top end of the contact plug is connected to the metal bit line, and a bottom end of the contact plug is connected to the drain region.

Optionally, the substrate is a P-type substrate, and the first conductive layer, the second conductive layer and the third conductive layer are all N-type doped; or the substrate is an N-type pad, and the first conductive layer, the second conductive layer and the third conductive layer are all P-type doped.

Optionally, a material of the first gate dielectric layer comprises one of an oxide and an oxynitride, and the first gate dielectric layer has a thickness ranging from 2 nm to 18 nm; a material of the second gate dielectric layer comprises one of an oxide and an oxynitride, and the second gate dielectric layer has a thickness ranging from 5 nm to 12 nm; a material of the tunneling dielectric layer comprises one of a group consisting of an oxide and an oxynitride, and the tunneling dielectric layer has a thickness ranging from 8 nm to 16 nm; materials of the first conductive layer, the second conductive layer and the third conductive layer all comprise doped polysilicon.

Optionally, the erasing gate structure extends horizontally to a top of the word line structure and partially overlaps the word line structure, and overlapping parts of the erasing gate structure and the word line structure are isolated from each other by an insulation layer.

The present invention further provides a manufacturing method for a non-volatile memory, comprising the following steps: providing a substrate, and forming a word line structure on the substrate, where the word line structure comprises a first gate dielectric layer, a first conductive layer and an insulation layer in sequence from bottom to top, and comprises isolation sidewalls formed on each side of the first conductive layer and each side of the insulation layer; forming at least one floating gate structure on one side of the word line structure, where the at least one floating gate structure comprises a second gate dielectric layer and a second conductive layer in sequence from bottom to top, and the second conductive layer has a first sharp portion, a second sharp portion and a sharp depression portion located between the first sharp portion and the second sharp portion; forming at least one erasing gate structure above the floating gate structure, where the at least one erasing gate structure comprises a tunneling dielectric layer and a third conductive layer in sequence from bottom to top, the tunneling dielectric layer covers tip parts of the first sharp portion and the second sharp portion and is filled into the sharp depression portion, and the third conductive layer has a third sharp portion at a position corresponding to the sharp depression portion.

Optionally, forming the floating gate structure comprises the following steps: forming the second gate dielectric layer on the surface of the substrate; forming the second conductive layer on the surface of the second gate dielectric layer, where the second conductive layer covers the word line structure, and the second conductive layer forms a curved step on two sides of the word line structure according to a shape of the word line structure; forming a dielectric layer on the surface of the second conductive layer; performing anisotropic etching to the dielectric layer, and reserving a part of the dielectric layer which is located on a sidewall of the curved step to form at least one dielectric sidewall; performing anisotropic etching to the second conductive layer until the insulation layer is exposed, where in the remaining second conductive layer, a part attached to the isolation sidewall forms the first sharp portion, a part attached to the dielectric sidewall forms the second sharp portion, and a part located between the first sharp portion and the second sharp portion forms the sharp depression portion; removing a part of the second conductive layer which is located on one side of the word line structure, and reserving a part of the second conductive layer which is located on the other side of the word line structure; and removing a part of the isolation sidewall and a part of the dielectric sidewall to expose the first sharp portion and the second sharp portion.

Optionally, the tunneling dielectric layer further covers non-tip parts of the second conductive layer, and the third conductive layer covers the tunneling dielectric layer.

Optionally, the manufacturing method for a non-volatile memory further comprises the following steps: forming at least one source region and at least one drain region in the substrate, where the word line structure, the floating gate structure and the erasing gate structure jointly form a gate structure, the source region and the drain region are located on each side of the gate structure respectively, the source region is close to the floating gate structure, and the drain region is close to the word line structure; forming a silicide layer on the surface of the source region, the surface of the drain region and the surface of the third conductive layer; forming an interlayer dielectric layer on the substrate to cover the gate structure; forming at least one contact plug in the interlayer dielectric layer, where a bottom end of the contact plug is connected to the drain region; and forming at least one metal bit line on the interlayer dielectric layer, where the metal bit line is connected to a top end of the contact plug.

Optionally, the substrate is a P-type substrate, and the first conductive layer, the second conductive layer and the third conductive layer are all N-type doped; or the substrate is an N-type pad, and the first conductive layer, the second conductive layer and the third conductive layer are all P-type doped.

Optionally, a material of the first gate dielectric layer comprises one of an oxide and an oxynitride, and the first gate dielectric layer has a thickness ranging from 2 nm to 18 nm; a material of the second gate dielectric layer comprises one of an oxide and an oxynitride, and the second gate dielectric layer has a thickness ranging from 5 nm to 12 nm; a material of the tunneling dielectric layer comprises one of a group consisting of an oxide and an oxynitride, and the tunneling dielectric layer has a thickness ranging from 8 nm to 16 nm; materials of the first conductive layer, the second conductive layer and the third conductive layer all comprise doped polysilicon.

Optionally, the erasing gate structure extends horizontally to above the word line structure and partially overlaps the word line structure, and overlapping parts of the erasing gate structure and the word line structure are isolated from each other by an insulation layer.

As described above, the non-volatile memory and the manufacturing method for the same according to the present invention have the following beneficial effects: A split-gate structure is used, thereby reducing the device size. A floating gate structure is located on one side of a word line structure, and has a first sharp portion, a second sharp portion, and a sharp depression portion located between the first and second sharp portions. An erasing gate is located above the floating gate structure and has a third sharp portion. The sharp portions of the floating gate help increase the thickness of the tunneling dielectric layer between the erasing gate and the floating gate to prevent a leakage current, so that the split-gate non-volatile memory has good data retention. Moreover, during a programming operation, the two sharp portions of the floating gate can significantly enhance an FN tunneling effect between the floating gate and the erasing gate; during an erase operation, the sharp portion of the erasing gate can realize injection of electrons from the erasing gate into the floating gate in an FN tunneling manner, thereby improving erase efficiency.

DESCRIPTIONS OF MARK REFERENCE NUMERALS

Figure 1:
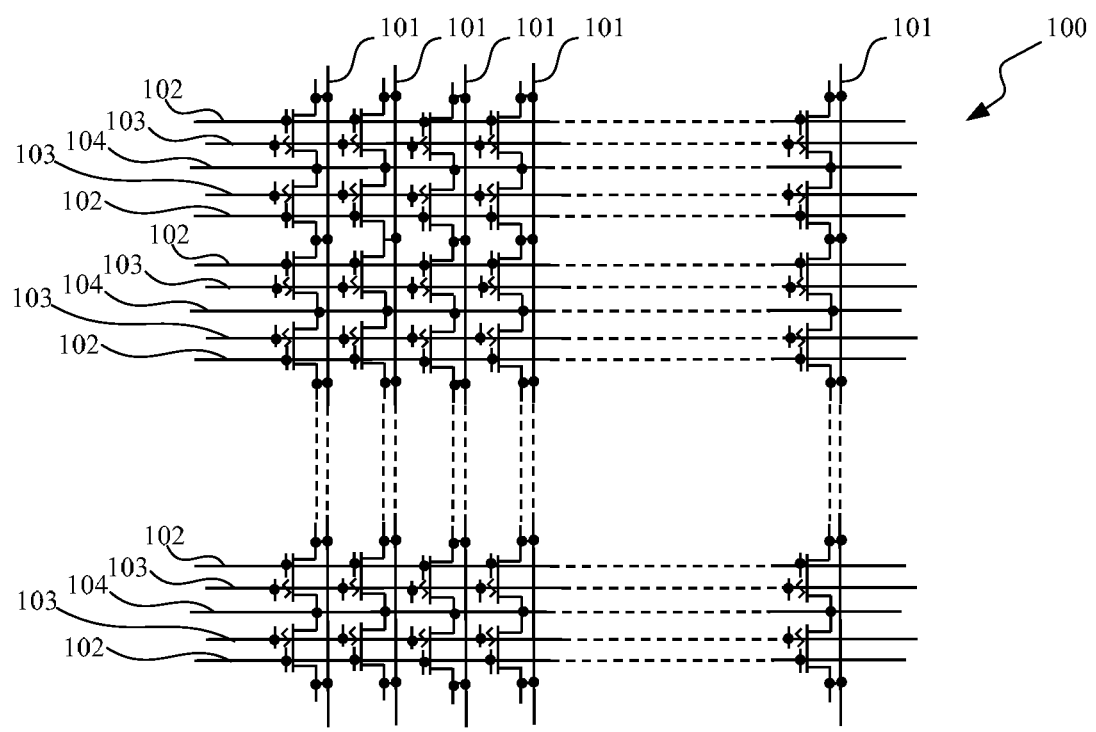
FIG. 1 is an array circuit diagram of a non-volatile memory according to the present invention.

100 Memory array
101 Bit line
102 Word line
103 Erasing gate line
104 Source line
105 Floating gate
106 Active region
107 Contact
201 Substrate
202 Shallow trench isolation structure
203 First gate dielectric layer
204 First conductive layer
205 Insulation layer
206 Photoresist layer
207 Dielectric layer
207a Isolation sidewall
208 Second gate dielectric layer
209 Second conductive layer
209a First sharp portion
209b Second sharp portion
209c Sharp depression portion
210 Dielectric layer
210a Dielectric sidewall
211 Photoresist layer
212 Tunneling dielectric layer
213 Third conductive layer
213a Third sharp portion
214 Photoresist layer
215a Heavily doped region
215b Lightly doped region
216 Sidewall structure
217a Lightly doped region
217b Heavily doped region
218 Silicide layer
219 Interlayer dielectric layer
220 Contact plug
221 Metal bit line

DETAILED DESCRIPTION OF THE PREFERRED EMBODIMENTS

Implementations of the present invention are illustrated below through specific embodiments. Persons skilled in the art can easily understand other advantages and efficacy of the present invention according to the content disclosed in this specification. The present invention can also be implemented or applied through other different specific implementations. Various modifications or variations can also be made on details in this specification based on different opinions and applications without departing from the spirit of the present invention.

Refer to FIGS. 1 to 32. It should be noted that, the figures provided in this embodiment merely illustrate the basic conception of the present invention schematically. Therefore, the figures only show components related to the present invention, and are not drawn according to the quantity, shapes and sizes of components during actual implementation. The pattern, quantity and ratio of components during actual implementation can be changed arbitrarily, and the component layout may also be more complex.

Referring to FIG. 1, FIG. 1 is an array circuit diagram of a non-volatile memory according to the present invention. A memory array 100 includes at least a bit line 101, at least a word line 102, at least an erasing gate line 103, and at least a source line 104. During an operation, a memory system applies a suitable signal to a selected bit line, a selected word line, and a selected erasing gate line to select a single memory cell. The memory system may read data from the memory cell, program the memory cell or erase the memory cell.

Figure 2:
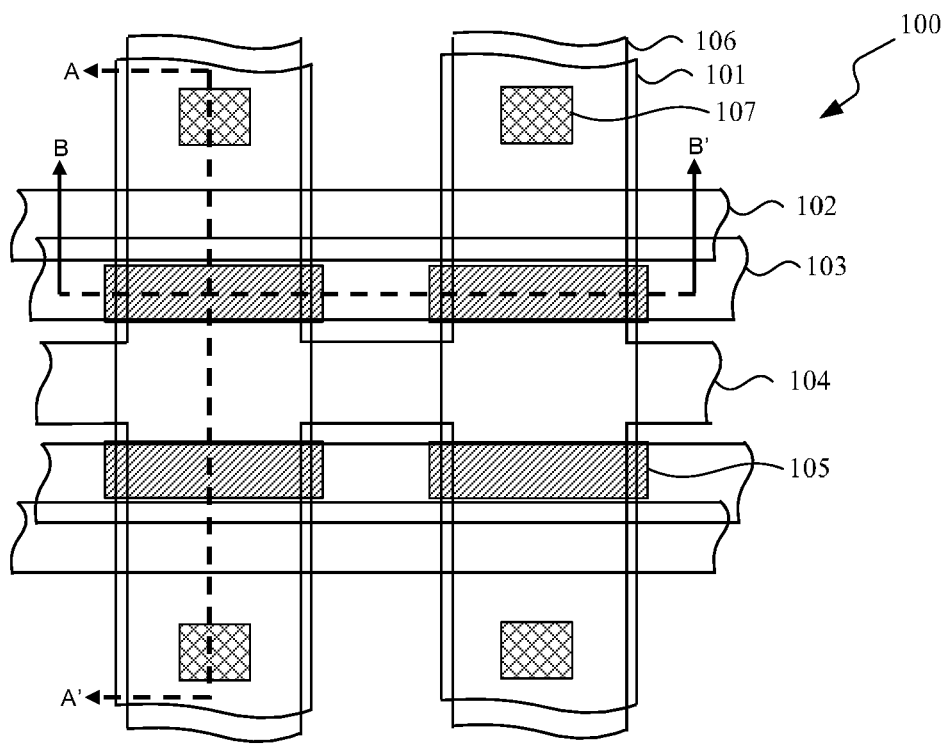
FIG. 2 is a top view of an array of a non-volatile memory according to the present invention.
Figure 29:
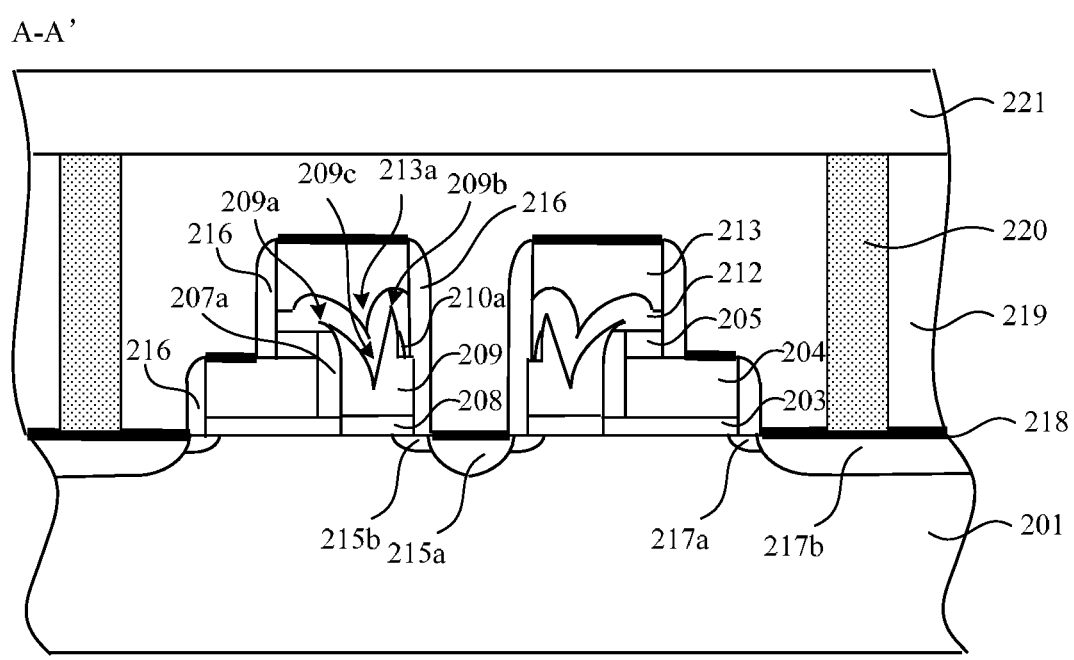
Figure 30:
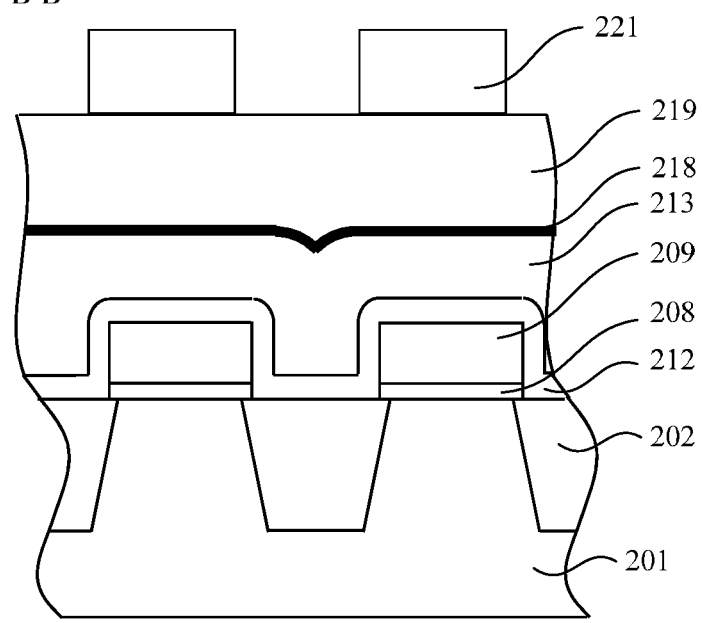

Referring to FIG. 2, FIG. 2 is a top view of the array of a non-volatile memory according to the present invention. The memory array 100 includes at least a bit line 101, at least a word line 102, at least an erasing gate line 103, at least a source line 104, at least a floating gate 105, an active region 106 and at least a contact 107. Referring to FIG. 29 and FIG. 30, FIG. 29 and FIG. 30 are a cross section diagram of FIG. 2 along direction A-A' and a cross section diagram of FIG. 2 along direction B-B' respectively. The bit line 101 may be implemented by a metal bit line 221. The word line 102 may be implemented by a first conductive layer 204. The floating gate 105 may be implemented by a second conductive layer 209. The erasing gate line 103 may be implemented by using a third conductive layer 213. The source line 104 may be implemented by using an active region, which also includes at least a transistor channel, at least a source region and at least a drain region.

Referring to FIGS. 3 to 30, cross section diagrams corresponding to each step in a manufacturing method for a non-volatile memory according to the present invention are shown along directions A-A' and B-B' of structures.

Figure 3:
FIGS. 3 to 30 are cross section diagrams corresponding to each step in a manufacturing method for a non-volatile memory according to the present invention.
Figure 4:
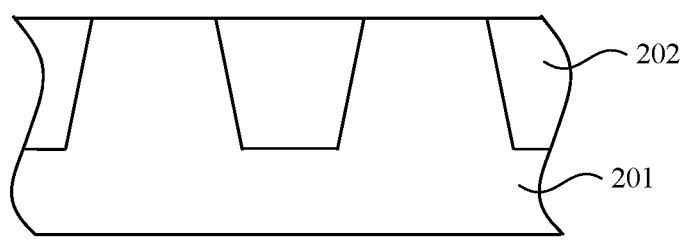

In FIG. 3 and FIG. 4, a substrate 201 is provided, and a shallow trench isolation (STI) structure 202 is formed in the substrate 201. The substrate 201 may be a P-type doped semiconductor substrate. The shallow trench isolation structure 202 may be implemented through standard STI manufacturing process steps, to define an active region in the substrate 201. It should be noted that, the substrate 201 may also be an N-type doped semiconductor substrate. In this case, all the doped regions in the subsequent description need to be changed from N-type to P-type. In another embodiment, the purely P-type substrate may be replaced with a triple-well structure. For example, the P-type substrate includes a deep N well, and a P well is formed in the N well.

Figure 5:
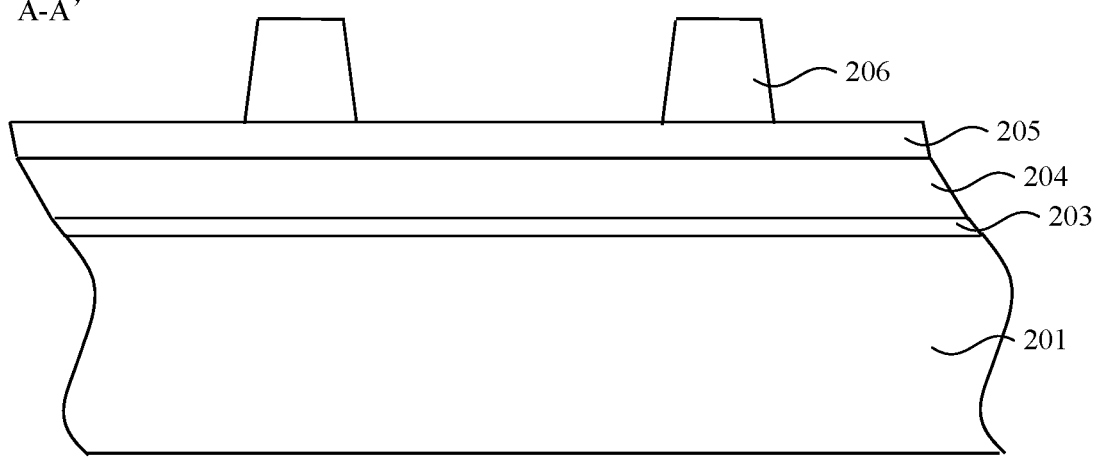
Figure 6:
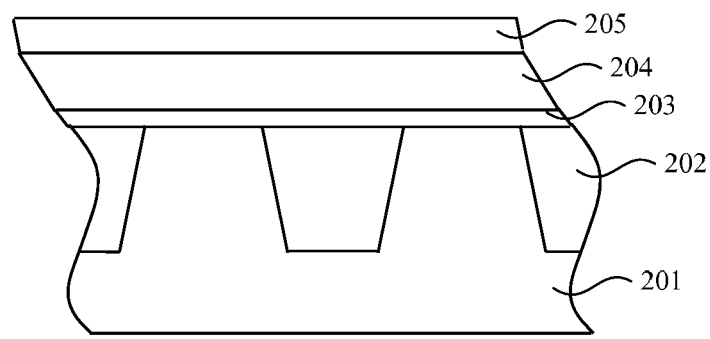

In FIG. 5 and FIG. 6, a first gate dielectric layer 203 is formed on the substrate 201 first; then, a first conductive layer 204 is formed on the first gate dielectric layer 203, and an insulation layer 205 is formed on the first gate dielectric layer 203; next, a patterned photoresist layer 206 is formed on the insulation layer 205 to define a word line region.

For example, the first gate dielectric layer 203 has a thickness ranging from 2 nm to 18 nm, the material thereof may be, but is not limited to one of an oxide (such as silicon oxide) and a oxynitride (such as silicon oxynitride). A material of the first conductive layer 204 may be N-type polysilicon. The insulation layer 205 has a thickness ranging from 50 to 200 nm, and a material thereof includes, an oxide or a nitride. But in the other embodiments, the material is not limited to the oxide or nitride. The patterned photoresist layer 206 may be formed by using a photolithography technique such as exposure and development.

Figure 7:
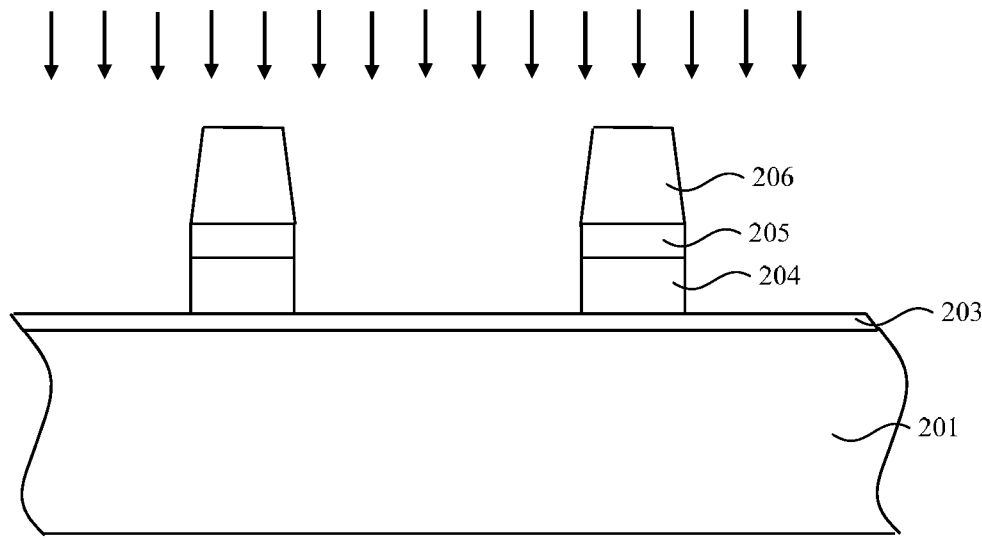
Figure 8:
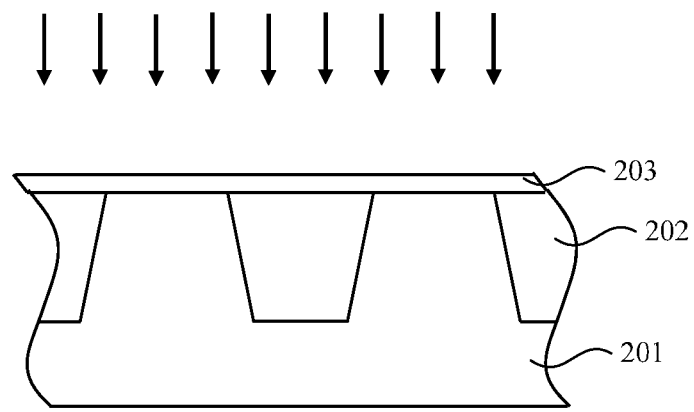

In FIG. 7 and FIG. 8, anisotropic etching is performed to remove part of the insulation layer 205 and part of the first conductive layer 204 that are not covered by the photoresist layer 206, so as to form the word line. In FIG. 7 and FIG. 8, the direction of the anisotropic etching is indicated by the arrows. In this embodiment, the anisotropic etching is y direction, that is, etching is performed vertically.

Figure 9:
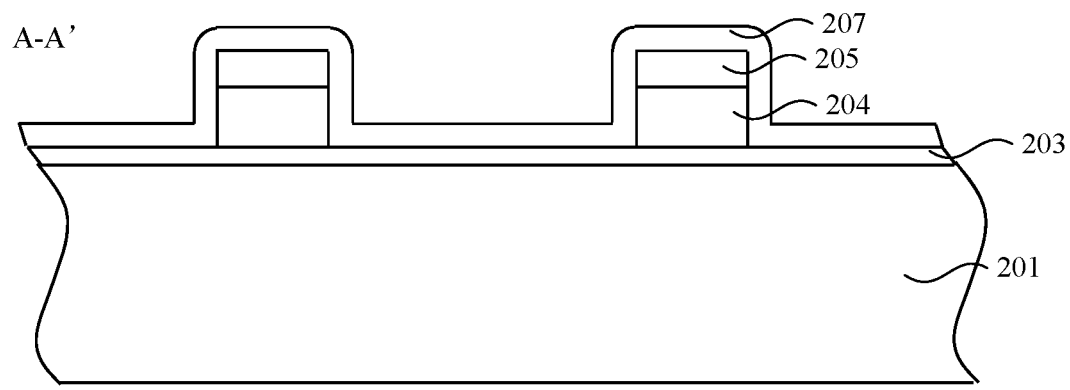
Figure 10:
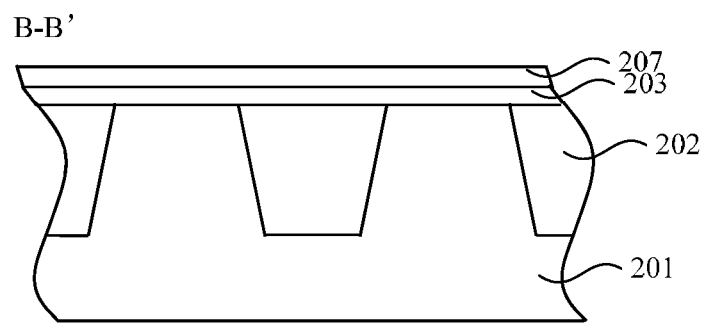

In FIG. 9 and FIG. 10, the photoresist layer 206 is removed first, and then a dielectric layer 207 is deposited. For example, the dielectric layer has a thickness ranging from 10 to 40 nm. The material thereof may be, but is not limited to, one of an oxide and a nitride, or include both an oxide and a nitride.

Figure 11:
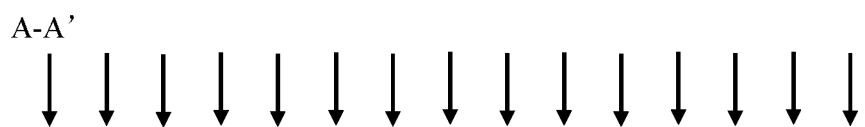
Figure 11:
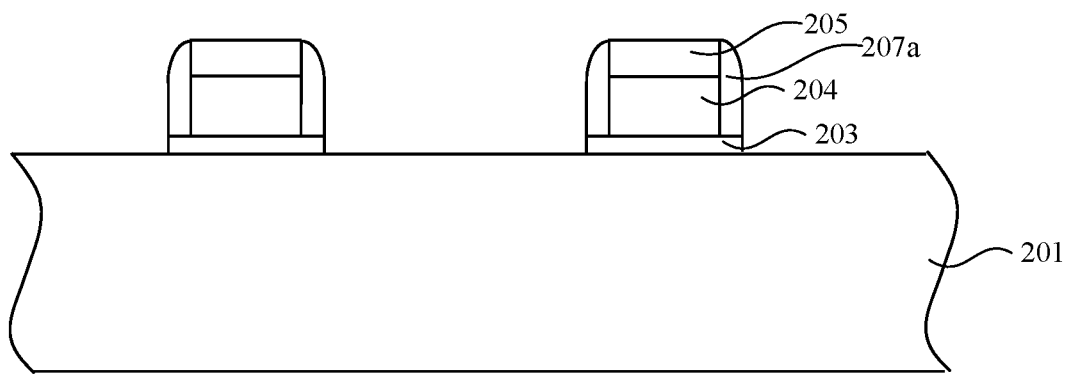
Figure 12:
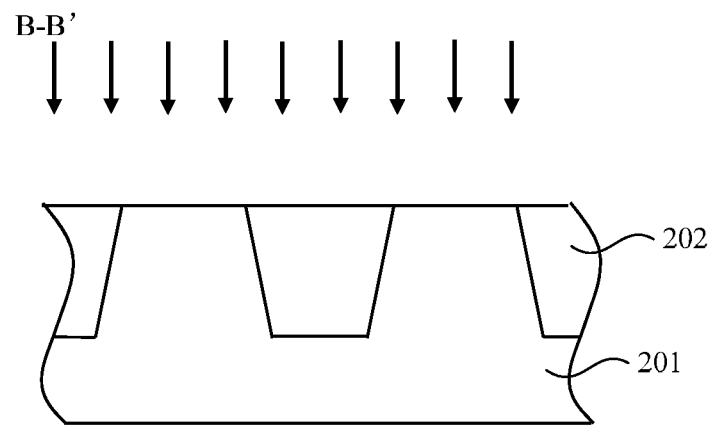

In FIG. 11 and FIG. 12, anisotropic etching is performed to remove part of the dielectric layer 207 and part of the first gate dielectric layer 203. The remaining dielectric layer located on each side of the insulation layer 205 and the first conductive layer 204 as isolation sidewalls 207a. The remaining first gate dielectric layer 203 is located under the isolation sidewalls 207a and the first conductive layer 203. In FIG. 11 and FIG. 12, the direction of the anisotropic etching is indicated by the arrows.

Figure 13:
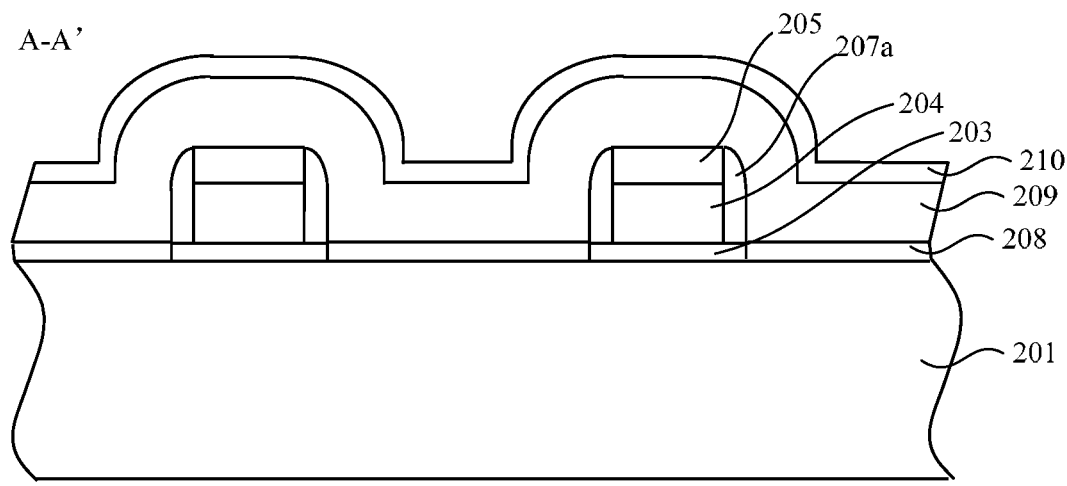
Figure 14:
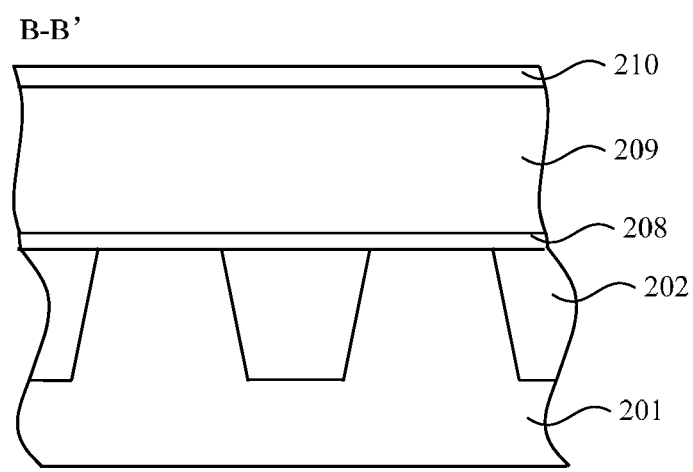

In FIG. 13 and FIG. 14, a second gate dielectric layer 208 is formed on the surface of the substrate 201 first, and then a second conductive layer 209 is formed on the surface of the second gate dielectric layer 208. The second conductive layer 209 covers the word line, and the second conductive layer 209 forms a curved step on each side of the word line structure according to a shape of the word line structure. Another dielectric layer 210 is further formed on the surface of the second conductive layer 209. For example, the second gate dielectric layer 208 has a thickness ranging from 5 nm to 12 nm. The second conductive layer 209 has a thickness ranging from 200 nm to 500 nm, the material thereof may be, but is not limited to, doped polysilicon, such as N-type doped polysilicon. The dielectric layer 210 has a thickness ranging from 10 nm to 40 nm, the material thereof may be, but is not limited to, one of an oxide and a nitride, or include both an oxide and a nitride.

Figure 15:
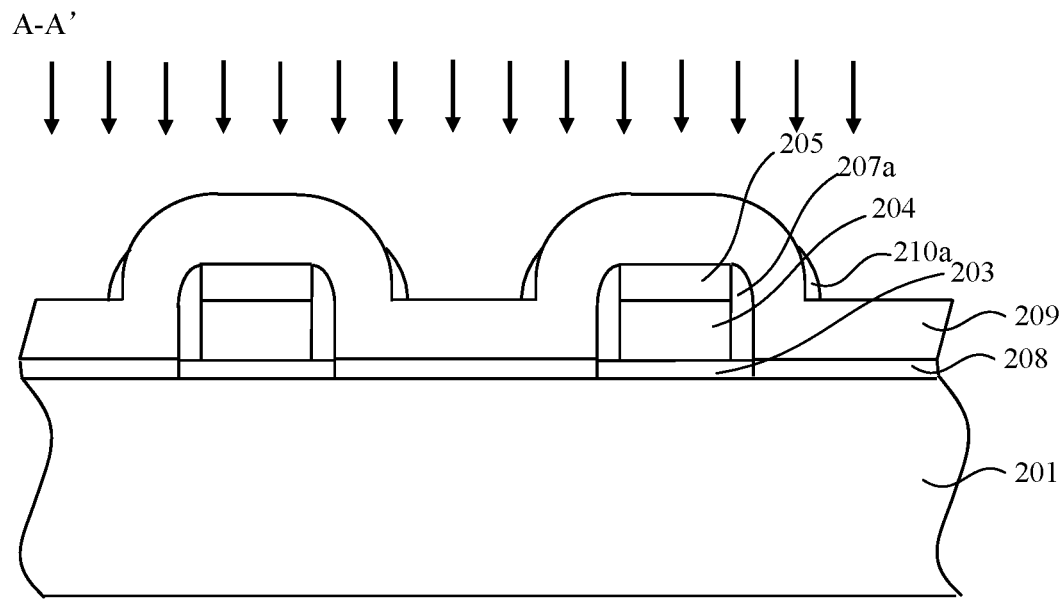
Figure 16:
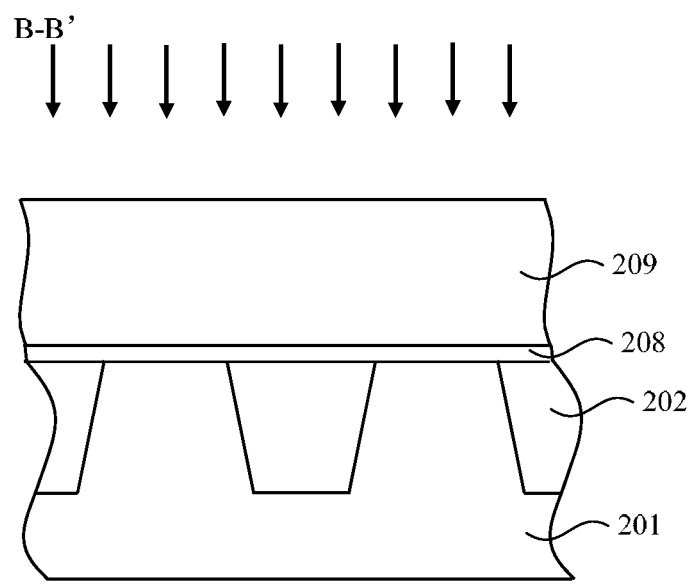

In FIG. 15 and FIG. 16, anisotropic etching is performed to remove part of the dielectric layer 210, and part of the dielectric layer 210 which is located on a sidewall of the curved step is reserved to form at least one dielectric sidewall 210a. In FIG. 15 and FIG. 16, the direction of the anisotropic etching is indicated by the arrows.

Figure 17:
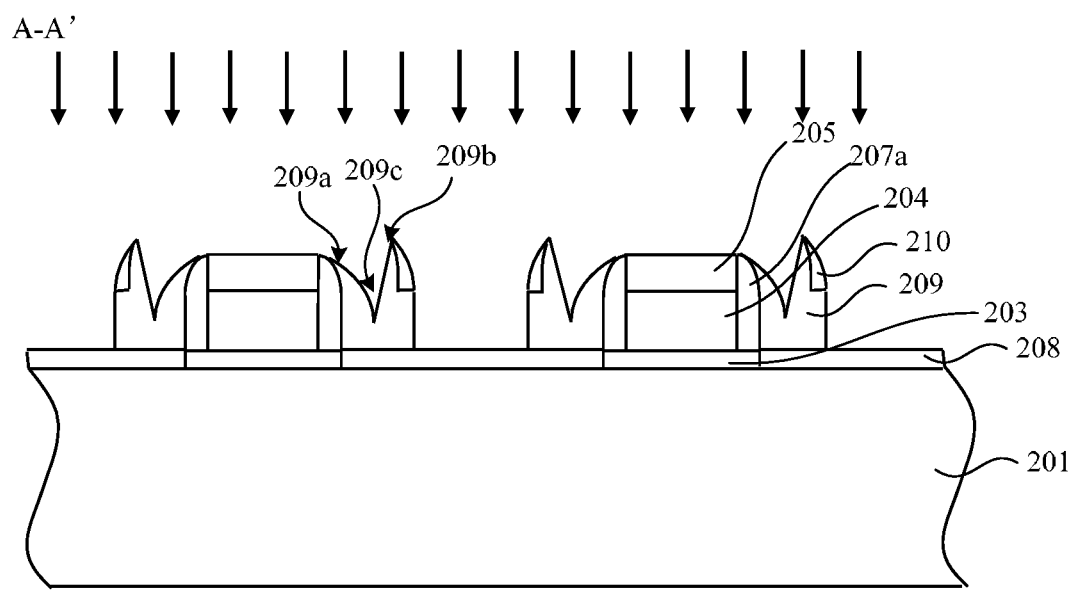
Figure 18:
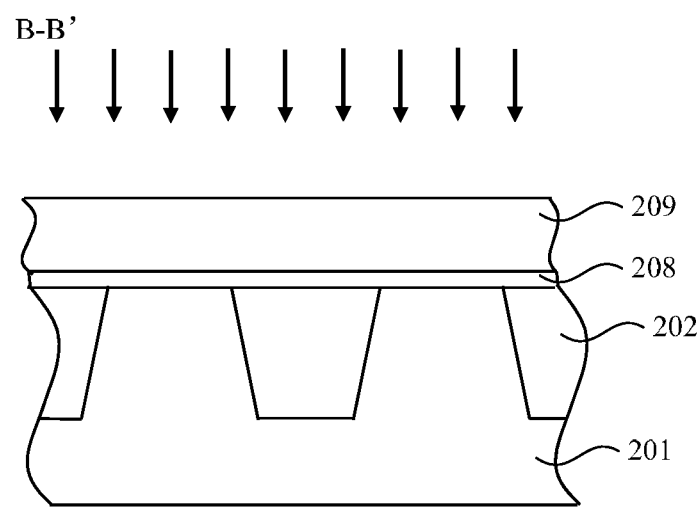

In FIG. 17 and FIG. 18, anisotropic etching is performed to the second conductive layer 209 by using the dielectric sidewall 210a as a mask, until the insulation layer 205 is exposed. In the remaining second conductive layer 205, a part attached to the isolation sidewall 207a forms a first sharp portion 209a, a part attached to the dielectric sidewall 210a forms a second sharp portion 209b, and a part located between the first sharp portion 209a and the second sharp portion 209b forms a sharp depression portion 209c. Tips of the first sharp portion 209a and the second sharp portion 209b are higher than the first conductive layer 204. In FIG. 17 and FIG. 18, the direction of the anisotropic etching is indicated by the arrows.

Figure 19:
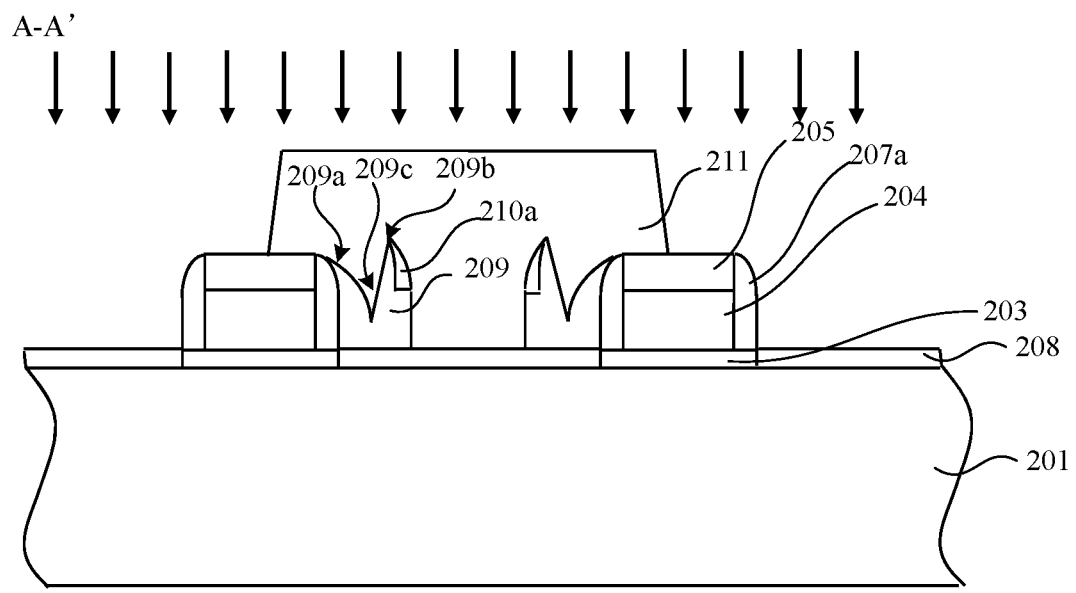
Figure 20:
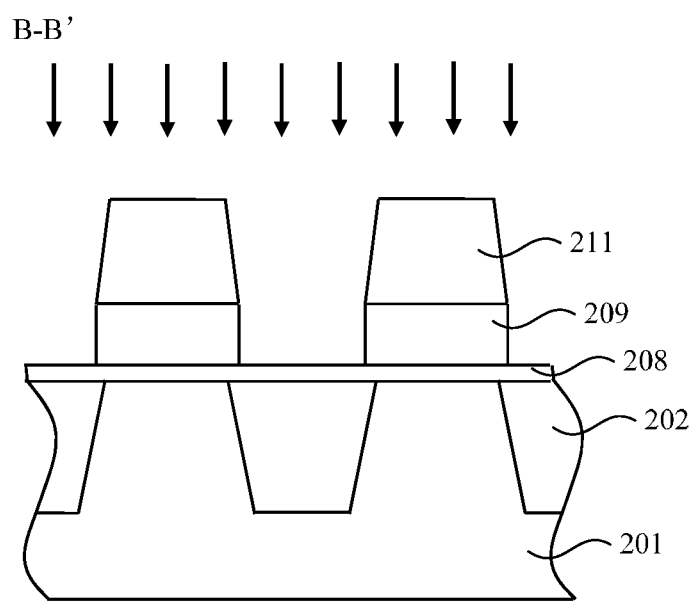

In FIG. 19 and FIG. 20, a patterned photoresist layer 211 is first formed on the structure obtained in the foregoing step, so as to define a floating gate region; then anisotropic etching is performed by using the photoresist layer 211 as a mask, to remove a part of the second conductive layer 209 and a part of the dielectric sidewall 210a that are located on one side of the word line structure, and reserve a part of the second conductive layer 209 and a part of the dielectric sidewall 210a that are located on the other side of the word line structure. The reserved part of the second conductive layer 209 is used as a floating gate. In FIG. 19 and FIG. 20, the direction of the anisotropic etching is indicated by arrows.

Figure 21:
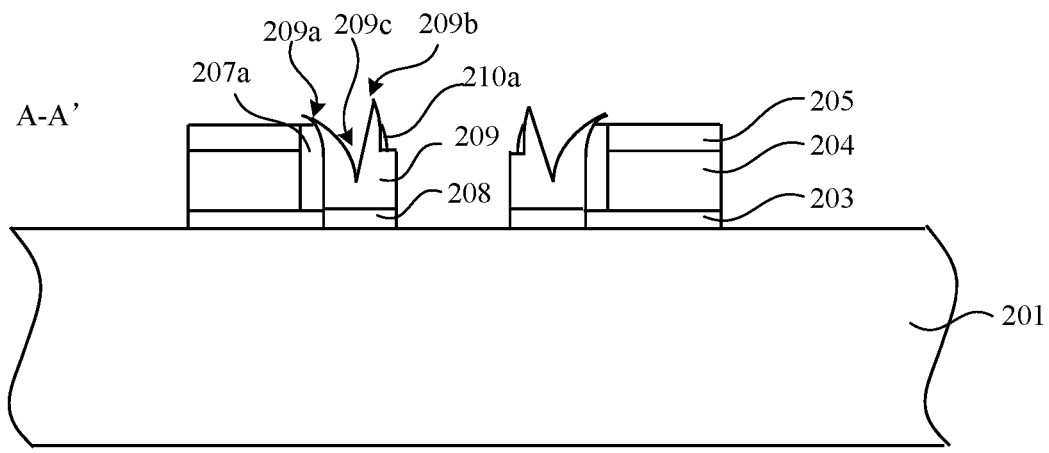
Figure 22:
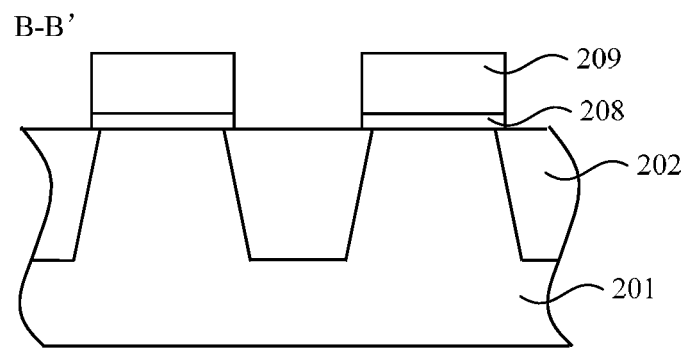

In FIG. 21 and FIG. 22, the photoresist layer 211 is removed, and etching is performed to remove part of the isolation sidewall 207a and part of the dielectric sidewall 210a to expose tip parts of the first sharp portion 209a and the second sharp portion 209b. In this embodiment, wet etching is preferably used in this step, and an etching thickness is 10 nm to 50 nm. The thickness of the insulation layer 205 is reduced. The isolation sidewall 207a on a side opposite to the floating gate and the first gate dielectric layer 203 under the isolation sidewall 207a are removed. A part of the second gate dielectric layer 208 which is not covered by the second conductive layer 209 is also removed.

Figure 23:
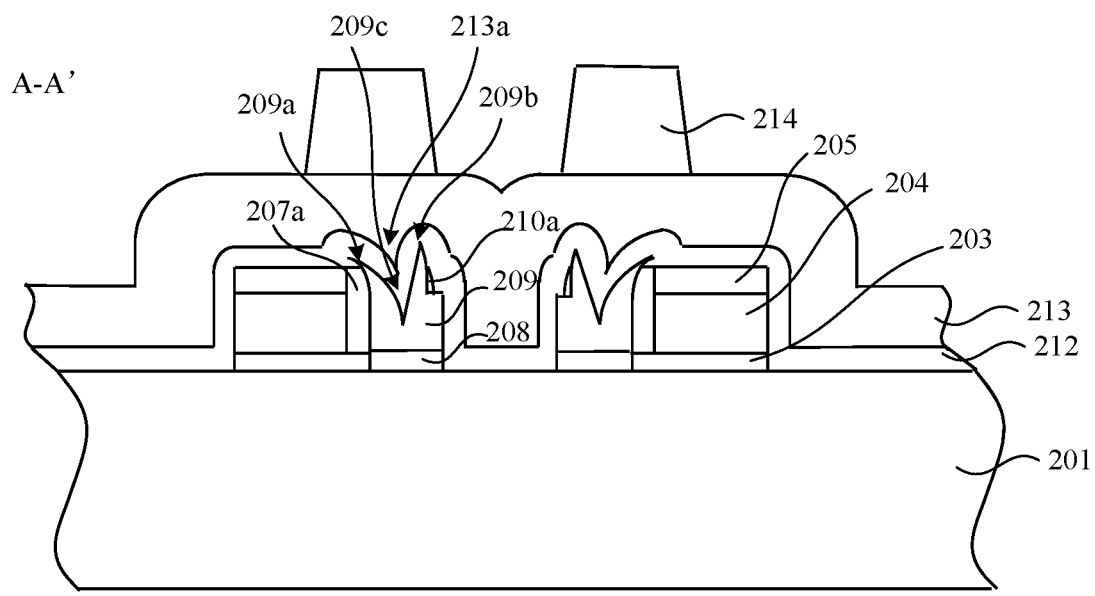
Figure 24:
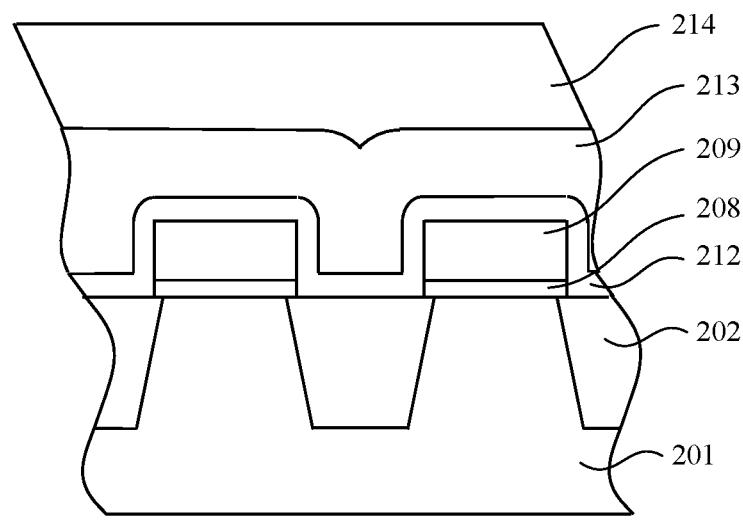

In FIG. 23 and FIG. 24, a tunneling dielectric layer 212 is formed on the structure obtained in the foregoing step, and a third conductive layer 213 is formed on the tunneling dielectric layer 212; then a patterned photoresist layer 214 is formed on the third conductive layer 213 to define an erasing gate (or a sense gate, referred to as SG for short) region. For example, the tunneling dielectric layer 212 has a thickness ranging from 8 nm to 16 nm, and a material thereof may be, but is not limited to, one of an oxide and a nitride, or include both an oxide and a nitride. In this embodiment, the tunneling dielectric layer 212 is preferably a high temperature oxide (HTO) and a thermal oxide, and is annealed in NO or $N_2O$ atmosphere. The third conductive layer 213 has a thickness ranging from 150 nm to 400 nm, and the material thereof may be, but is not limited to, doped polysilicon, such as N-type doped polysilicon.

Figure 25:
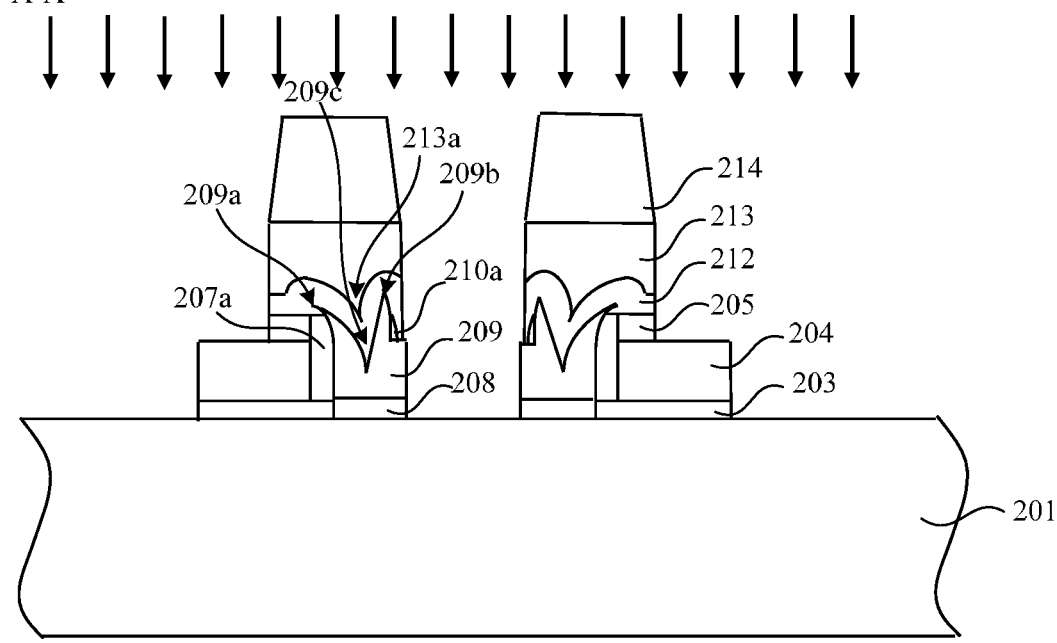
Figure 26:
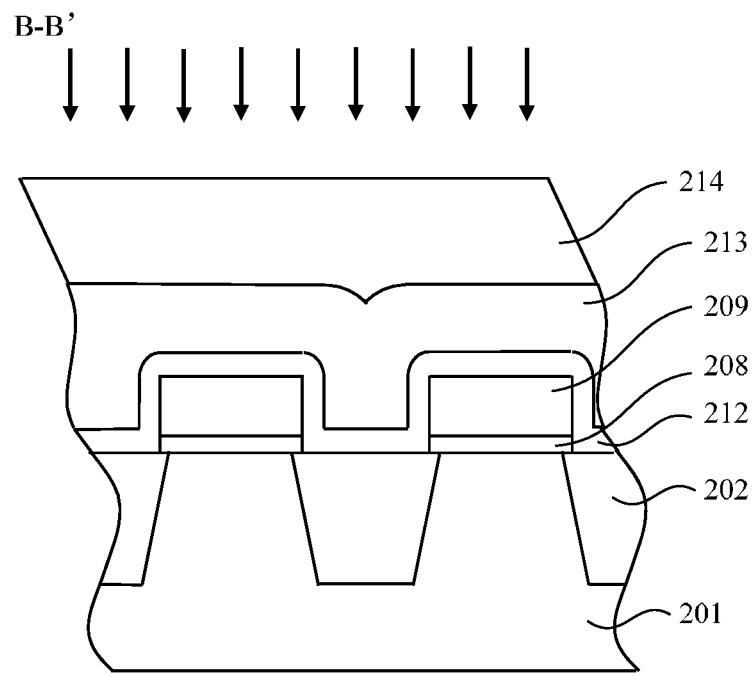

In FIG. 25 and FIG. 26, anisotropic etching is performed to the third conductive layer 213 and the tunneling dielectric layer 212 by using the photoresist layer 214 as a mask, to obtain an erasing gate structure located above the floating gate structure. The erasing gate structure includes the tunneling dielectric layer 212 and the third conductive layer 213 in sequence from bottom to top. The tunneling dielectric layer 212 covers the tip parts of the first sharp portion and the second sharp portion, and is filled into the sharp depression portion. The third conductive layer 213 has a third sharp portion at a position corresponding to the sharp depression portion. In this embodiment, the tunneling dielectric layer 213 further cover non-tip parts of the second conductive layer 209, and the third conductive layer 213 covers the tunneling dielectric layer 212. In FIG. 25 and FIG. 26, the direction of the anisotropic etching is indicated by the arrows. Then, exposed part of the insulation layer 205 is removed. A method for removal may be dry etching followed by wet etching, or wet etching only. It should be noted that, the insulation layer 205 on the first conductive layer 204 may be removed partially or completely. In this embodiment, a part of the insulation layer 205 is reserved. The erasing gate structure extends horizontally to the top of the word line structure and partially overlaps the word line structure, and overlapping parts of the erasing gate structure and the word line structure are isolated from each other by the reserved insulation layer 205.

Figure 27:
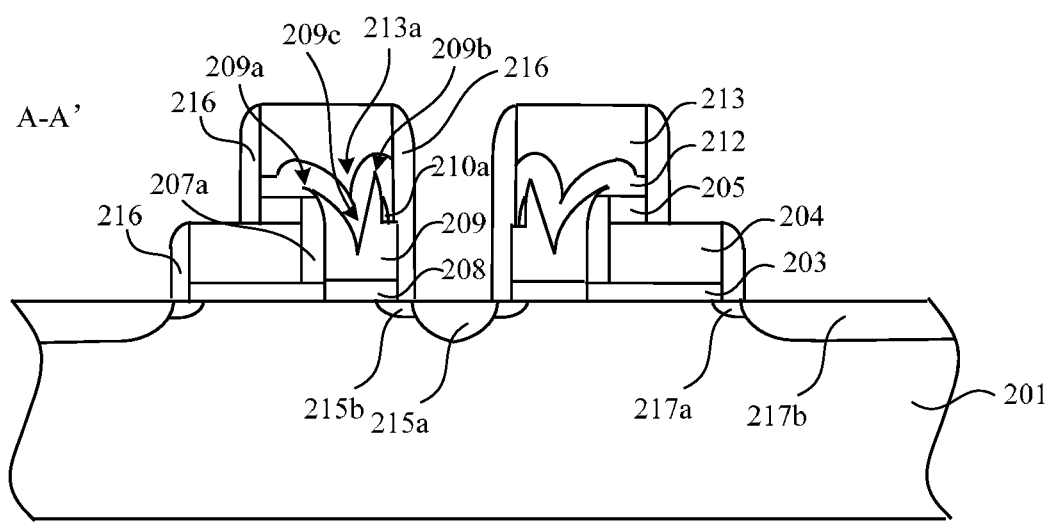
Figure 28:
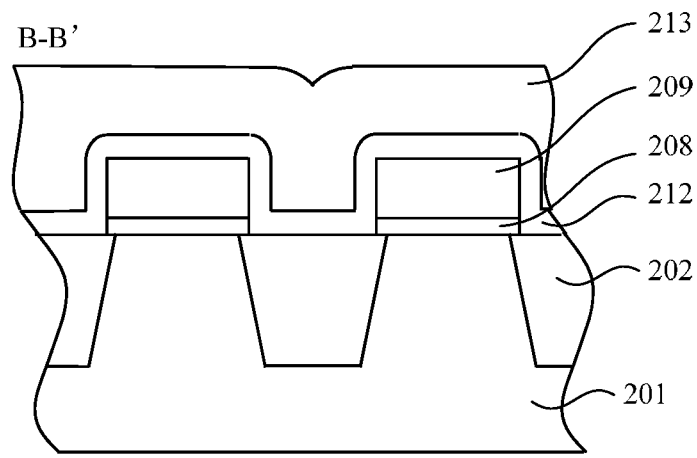

In FIG. 27 and FIG. 28, the photoresist layer 214 is removed, and then a lightly doped source/drain (Ldd), a sidewall structure and an N-type heavily doped region are formed through standard integrated circuit manufacturing steps, so that the source region and the drain region are located in the substrate. The word line structure, the floating gate structure and the erasing gate structure jointly form a gate structure. The source region and the drain region are located on each side of the gate structure respectively, the source region is close to the floating gate structure, and the drain region is close to the word line structure. In this embodiment, the source region includes a heavily doped region 215a and a lightly doped region 215b. The drain region includes a lightly doped region 217a and a heavily doped region 217b. In another embodiment, the Ldd and the sidewall structure may not be formed.

In FIG. 29 and FIG. 30, a back end process in standard integrated circuit manufacturing is further performed to form a silicide layer 218 (self-aligned silicide), an interlayer dielectric layer 219, at least a contact, at least a contact plug 220 and at least a metal bit line 221. Specifically, the silicide layer 218 is formed on the surface of the source region, the surface of the drain region, and the surface of the third conductive layer 213. The interlayer dielectric layer 219 is formed on the substrate 201 to cover the gate structure. The contact plug 220 is formed in the interlayer dielectric layer 219. A bottom end of the contact plug 220 is connected to the drain region. Then, the metal bit line 221 is formed on the interlayer dielectric layer 219. The metal bit line 221 is connected to the top end of the contact plug 220. In another embodiment, the silicide layer 218 may not be formed.

So far, a non-volatile memory is obtained. The non-volatile memory includes a substrate 201, at least one word line structure, at least one floating gate structure and at least one erasing gate structure. The word line structure is located on the substrate 201 and includes a first gate dielectric layer 203 and a first conductive layer 204 in sequence from bottom to top. The floating gate structure is on the substrate and is located on one side of the word line structure, and includes a second gate dielectric layer 208 and a second conductive layer 209 in sequence from bottom to top. An isolation sidewall 207a is disposed between the second conductive layer 209 and the word line structure. The second conductive layer 209 has a first sharp portion 209a, a second sharp portion 209b, and a sharp depression portion 209c located between the first sharp portion and the second sharp portion. The first sharp portion and the second sharp portion of the floating gate are higher than the word line structure. The erasing gate structure is located above the floating gate structure and includes a tunneling dielectric layer 212 and a third conductive layer 213 in sequence from bottom to top. The tunneling dielectric layer 212 covers tip parts of the first sharp portion 209a and the second sharp portion 209b, and is filled into the sharp depression portion 209c. The third conductive layer 213 has a third sharp portion 213a at a position corresponding to the sharp depression portion 209c. In this embodiment, the tunneling dielectric layer 212 further covers other parts (non-tip parts) of the second conductive layer 209, and the third conductive layer 213 covers the tunneling dielectric layer 212. The erasing gate structure can further extend horizontally to above the word line structure and partially overlap the word line structure. Overlapping parts of the erasing gate structure and the word line structure are isolated from each other by an insulation layer (205). A concave corner is formed on an external sidewall of the second sharp portion 209b. A dielectric sidewall 210a may be provided at the concave corner. The non-volatile memory further includes at least one source region and at least one drain region. The word line structure, the floating gate structure and the erasing gate structure jointly form a gate structure. The source region and the drain region are in the substrate, and are located on each side of the gate structure respectively. The source region is close to the floating gate structure, and the drain region is close to the word line structure. The non-volatile memory may further include at least one sidewall structure 216. The sidewall structure 216 is located on each side of the gate structure. The non-volatile memory may further include a silicide layer 218, an interlayer dielectric layer 219, at least one metal bit line 221 and at least one contact plug 220. The silicide layer is located on the surface of the source region, the surface of the drain region and the surface of the third conductive layer. The interlayer dielectric layer is located on the substrate and covers the gate structure. The metal bit line is located on the interlayer dielectric layer. The contact plug is located in the interlayer dielectric layer. A top end of the contact plug is connected to the metal bit line, and a bottom end of the contact plug is connected to the drain region. The substrate may be a P-type substrate, and correspondingly, the first conductive layer, the second conductive layer and the second conductive layer are all N-type doped; or the substrate is an N-type pad, and correspondingly, the first conductive layer, the second conductive layer and the second conductive layer are all P-type doped. The substrate may also be a triple-well structure. A material of the first gate dielectric layer includes either of an oxide and an oxynitride, and the first gate dielectric layer has a thickness ranging from 2 nm to 18 nm. A material of the second gate dielectric layer may be one of an oxide and an oxynitride. The second gate dielectric layer has a thickness ranging from 5 nm to 12 nm. A material of the tunneling dielectric layer may be one of a group consisting of an oxide and an oxynitride, and the tunneling dielectric layer has a thickness ranging from 8 nm to 16 nm. Materials of the first conductive layer, the second conductive layer and the third conductive layer may all include doped polysilicon.

The non-volatile memory according to the present invention can be read based on a suitable bias condition. Table 1 lists examples of read bias conditions of the memory transistor.

TABLE 1

| Read bias condition | |
| --- | --- |
| Selected word line | 1.5-3.6 V |
| Selected erasing gate | 0-3 V |
| Selected bit line | 0.8-2 V |
| All others | 0 V |

Figure 31:
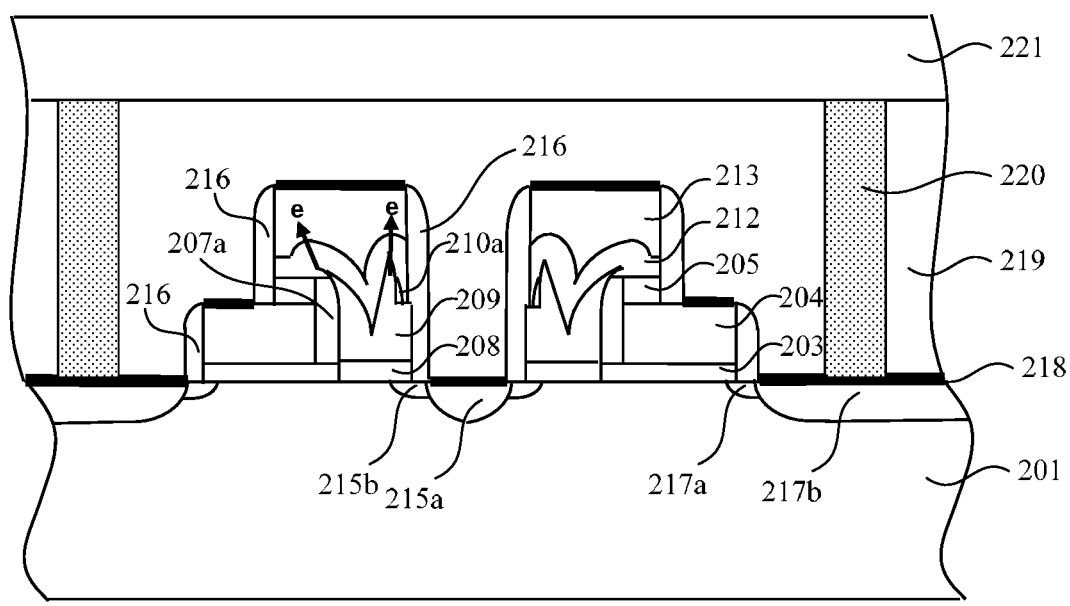
FIG. 31 is a principle diagram of a programming operation on a non-volatile memory according to the present invention.

FIG. 31 is a principle diagram of a programming operation on a non-volatile memory according to the present invention. During programming, the memory cell on the left is selected, and the memory cell on the right is not selected. During a programming operation, electrons (e) are injected from the floating gate (FG) to the erasing gate (SG). Two sharp portions of the floating gate can significantly enhance an FN tunneling effect between the floating gate and the erasing gate.

Figure 32:
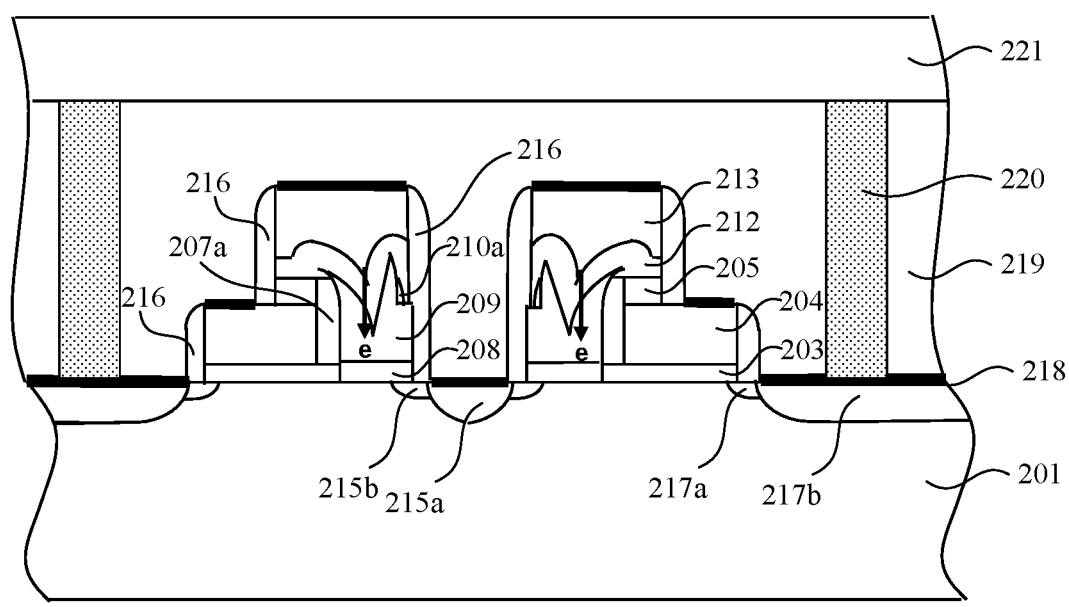
FIG. 32 is principle diagrams of an erase operation on a non-volatile memory according to the present invention.

In FIG. 32, the path of electrons e is shown by arrows. Table 2 lists examples of programming bias conditions of the memory transistor. It should be noted that, in a negative logical condition, the programmed cell is in an ON state.

TABLE 2

| Programming bias condition | |
| --- | --- |
| Selected word line | 5-11 V |
| Unselected word line | 0 V |
| Selected erasing gate | 8-16 V |
| Unselected erasing gate | 0 V |
| Source line | Floating |

TABLE 2-continued

| Programming bias condition | |
| --- | --- |
| Selected bit line | 0 V |
| Unselected bit line | 4-10 V |
| All others | 0 V |

FIG. 32 is a principle diagram of an erase operation on a non-volatile memory according to the present invention. When erasing the entire array, the electrons can be rejected from the erasing gate to the floating gate in an FN tunneling manner due to the sharp portion of the erasing gate, thereby improving the erase efficiency. The erasing gate can be grouped into sectors or blocks, and in this case, the erase operation can be performed on the sectors or blocks. In FIG. 32, a path of electrons e is shown by the arrows. Table 3 lists examples of erase bias conditions of the memory transistor. It should be noted that, in a negative logical condition, the erased cell is in an OFF state.

TABLE 3

| Erase bias condition | |
| --- | --- |
| Selected erasing gate | (−8)-(−16) V |
| Unselected erasing gate | 0 V |
| All bit lines and source lines | 0 V or floating |
| All others | 0 V |

It should be noted that, if the purely P-type substrate is replaced with a triple-well structure, for example, the P-type substrate includes a deep N well, and a P well is formed in the N well, the erase bias condition will be different. Table 4 lists examples of erase bias conditions of the memory transistor when the substrate uses a triple-well structure.

TABLE 4

| Erase bias condition | |
| --- | --- |
| Selected erasing gate | (−6)-(0) V |
| Unselected erasing gate | 0 V |
| All bit lines and source lines | Floating |
| Selected P well | 8-16 V |
| Deep N well | Floating |
| All others | 0 V |

It should be noted that, the erasing gate also has a current sensing function, and therefore can be used as a sense gate.

In conclusion, a split-gate structure is used in the present invention, thereby helping reduce the device size. A floating gate structure is located on one side of a word line structure, and has a first sharp portion, a second sharp portion, and a sharp depression portion located between the first and second sharp portions. An erasing gate is located above the floating gate structure and has a third sharp portion. The sharp portions of the floating gate help increase the thickness of the tunneling dielectric layer between the erasing gate and the floating gate to prevent current leakage, so that the split-gate non-volatile memory has good data retention. Moreover, during a programming operation, the two sharp portions of the floating gate can significantly enhance an FN tunneling effect between the floating gate and the erasing gate; during an erase operation, the sharp portion of the erasing gate can realize injection of electrons from the erasing gate into the floating gate in an FN tunneling manner, thereby improving erase efficiency. Therefore, the present invention effectively overcomes various disadvantages in the prior art and hence has high industrial use value.

The foregoing embodiments are only to illustrate the principle and efficacy of the present invention exemplarily, and are not to limit the present invention. Any person skilled in the art can make modifications or variations on the foregoing embodiments without departing from the spirit and scope of the present invention. Accordingly, all equivalent modifications or variations completed by persons of ordinary skill in the art without departing from the spirit and technical thinking disclosed by the present invention should fall within the scope of claims of the present invention.

What is claimed is:

1. A non-volatile memory, comprising:
a substrate;
at least one word line structure, located on the substrate, wherein the at least one word line structure comprises a first gate dielectric layer and a first conductive layer in sequence from bottom to top;
at least one floating gate structure, located on the substrate, wherein the at least one floating gate structure is located on one side of the at least one word line structure, and comprises a second gate dielectric layer and a second conductive layer in sequence from bottom to top, wherein an isolation sidewall is disposed between the second conductive layer and the word line structure, and the second conductive layer has a first sharp portion, a second sharp portion, and a sharp depression portion located between the first sharp portion and the second sharp portion; and
at least one erasing gate structure, located above the at least one floating gate structure, wherein the at least one erasing gate structure comprises a tunneling dielectric layer and a third conductive layer in sequence from bottom to top, wherein the tunneling dielectric layer covers tip parts of the first sharp portion and the second sharp portion, and is filled into the sharp depression portion, wherein the third conductive layer has a third sharp portion at a position corresponding to the sharp depression portion.

2. The non-volatile memory according to claim 1, wherein a concave corner is formed on an external sidewall of the second sharp portion, and a dielectric sidewall is provided at the concave corner.

3. The non-volatile memory according to claim 1, wherein the tunneling dielectric layer further covers non-tip parts of the second conductive layer, and the third conductive layer covers the tunneling dielectric layer.

4. The non-volatile memory according to claim 1, further comprising at least one source region and at least one drain region, wherein the word line structure, the floating gate structure, and the erasing gate structure jointly form a gate structure, the source region and the drain region are located in the substrate, and are located on one side of the gate structure respectively, the source region is close to the floating gate structure, and the drain region is close to the word line structure.

5. The non-volatile memory according to claim 4, further comprising at least one sidewall structure, wherein the sidewall structure is located on each side of the gate structure.

6. The non-volatile memory according to claim 4, further comprising a silicide layer, an interlayer dielectric layer, at least one metal bit line, and at least one contact plug, wherein the silicide layer is located on the surface of the source region, the surface of the drain region and the surface of the third conductive layer; the interlayer dielectric layer is located on the substrate and covers the gate structure, the at least one metal bit line is located on the interlayer dielectric layer, the at least one contact plug is located in the interlayer dielectric layer, a top end of the contact plug is connected to the metal bit line, and a bottom end of the contact plug is connected to the drain region.

7. The non-volatile memory according to claim 1, wherein the substrate is a P-type substrate, and the first conductive layer, the second conductive layer and the third conductive layer are all N-type doped; or alternatively, the substrate is an N-type pad, and the first conductive layer, the second conductive layer and the third conductive layer are all P-type doped.

8. The non-volatile memory according to claim 1, wherein a material of the first gate dielectric layer comprises one of an oxide and an oxynitride, and the first gate dielectric layer has a thickness ranging from 2 nm to 18 nm; a material of the second gate dielectric layer comprises one of an oxide and an oxynitride, and the second gate dielectric layer has a thickness ranging from 5 nm to 12 nm; a material of the tunneling dielectric layer comprises one of a group consisting of an oxide and an oxynitride, and the tunneling dielectric layer has a thickness ranging from 8 nm to 16 nm; materials of the first conductive layer, the second conductive layer and the third conductive layer all comprise doped polysilicon.

9. The non-volatile memory according to claim 1, wherein the erasing gate structure extends horizontally to a top of the word line structure, and partially overlaps the word line structure, overlapping parts of the erasing gate structure and the word line structure are isolated from each other by an insulation layer.

10. A manufacturing method for a non-volatile memory, comprising the following steps:
providing a substrate, and forming a word line structure on the substrate, wherein the word line structure comprises a first gate dielectric layer, a first conductive layer and an insulation layer in sequence from bottom to top, and comprises isolation sidewalls formed on each side of the first conductive layer and each side of the insulation layer;
forming at least one floating gate structure on one side of the word line structure, wherein the at least one floating gate structure comprises a second gate dielectric layer and a second conductive layer in sequence from bottom to top, the second conductive layer has a first sharp portion, a second sharp portion, and a sharp depression portion located between the first sharp portion and the second sharp portion; and
forming at least one erasing gate structure above the floating gate structure, wherein the at least one erasing gate structure comprises a tunneling dielectric layer and a third conductive layer in sequence from bottom to top, the tunneling dielectric layer covers tip parts of the first sharp portion and the second sharp portion and is filled into the sharp depression portion, and the third conductive layer has a third sharp portion at a position corresponding to the sharp depression portion.

11. The manufacturing method for a non-volatile memory according to claim 10, wherein forming the floating gate structure comprises the following steps:
forming the second gate dielectric layer on the surface of the substrate;
forming the second conductive layer on the surface of the second gate dielectric layer, where the second conductive layer covers the word line structure, and the second conductive layer forms a curved step on two sides of the word line structure according to a shape of the word line structure;
forming a dielectric layer on the surface of the second conductive layer;
performing anisotropic etching to the dielectric layer, and reserving a part of the dielectric layer which is located on a sidewall of the curved step to form at least one dielectric sidewall;
performing anisotropic etching to the second conductive layer until the insulation layer is exposed, wherein in the remaining second conductive layer, a part attached to the isolation sidewall forms the first sharp portion, a part attached to the dielectric sidewall forms the second sharp portion, and a part located between the first sharp portion and the second sharp portion forms the sharp depression portion;
removing a part of the second conductive layer which is located on one side of the word line structure, and reserving a part of the second conductive layer which is located on the other side of the word line structure; and
removing a part of the isolation sidewall and a part of the dielectric sidewall to expose the first sharp portion and the second sharp portion.

12. The manufacturing method for a non-volatile memory according to claim 10, wherein the tunneling dielectric layer further covers non-tip parts of the second conductive layer, and the third conductive layer covers the tunneling dielectric layer.

13. The manufacturing method for a non-volatile memory according to claim 10, further comprising the following steps:
forming at least one source region and at least one drain region in the substrate, wherein the word line structure, the floating gate structure and the erasing gate structure jointly form a gate structure, the source region and the drain region are located on one side of the gate structure respectively, the source region is close to the floating gate structure, and the drain region is close to the word line structure;
forming a silicide layer on the surface of the source region, the surface of the drain region and the surface of the third conductive layer;
forming an interlayer dielectric layer on the substrate to cover the gate structure;
forming at least one contact plug in the interlayer dielectric layer, wherein a bottom end of the contact plug is connected to the drain region; and
forming at least one metal bit line on the interlayer dielectric layer, wherein the metal bit line is connected to a top end of the contact plug.

14. The manufacturing method for a non-volatile memory according to claim 10, wherein the substrate is a P-type substrate, and the first conductive layer, the second conductive layer and the third conductive layer are all N-type doped; or alternatively the substrate is an N-type pad, and the first conductive layer, the second conductive layer and the third conductive layer are all P-type doped.

15. The manufacturing method for a non-volatile memory according to claim 10, wherein a material of the first gate dielectric layer comprises one of an oxide and an oxynitride, and the first gate dielectric layer has a thickness ranging from 2 nm to 18 nm; a material of the second gate dielectric layer comprises one of an oxide and an oxynitride, and the second gate dielectric layer has a thickness ranging from 5 nm to 12 nm; a material of the tunneling dielectric layer comprises one of a group consisting of an oxide and an oxynitride, and the tunneling dielectric layer has a thickness ranging from 8 nm to 16 nm; materials of the first conductive layer, the second conductive layer and the third conductive layer all comprise doped polysilicon.

16. The manufacturing method for a non-volatile memory according to claim 10, wherein the erasing gate structure extends horizontally to above the word line structure and partially overlaps the word line structure, and overlapping parts of the erasing gate structure and the word line structure are isolated from each other by an insulation layer.

* * * * *